United States Patent
Zhang et al.

(10) Patent No.: US 9,294,120 B2
(45) Date of Patent: Mar. 22, 2016

(54) DIGITAL TECHNIQUE FOR EXCESS LOOP DELAY COMPENSATION IN A CONTINUOUS-TIME DELTA SIGMA MODULATOR

(71) Applicant: Maxim Integrated Products, Inc., San Jose, CA (US)

(72) Inventors: Yi Zhang, Corvallis, OR (US); Phillip Elliott, Fort Collins, CO (US); Ed Liu, Milpitas, CA (US); Yang Qian, Fremont, CA (US); Geir Ostrem, Colorado Springs, CO (US); John Frank Scampini, Lexington, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/822,061

(22) Filed: Aug. 10, 2015

(65) Prior Publication Data

US 2016/0056838 A1 Feb. 25, 2016

Related U.S. Application Data

(63) Continuation of application No. 14/590,100, filed on Jan. 6, 2015, now Pat. No. 9,106,255.

(60) Provisional application No. 62/039,647, filed on Aug. 20, 2014.

(51) Int. Cl.
*H03M 3/00* (2006.01)

(52) U.S. Cl.
CPC .............. *H03M 3/422* (2013.01); *H03M 3/464* (2013.01); *H03M 3/496* (2013.01)

(58) Field of Classification Search
CPC ......... H03M 3/43; H03M 1/12; H03M 3/426; H03M 3/438; H03M 3/424; H03M 3/456; H03M 1/361; H03M 3/422; H03M 1/00; H03M 3/30; H03M 3/458; H03M 3/50
USPC .......................................... 341/143, 118, 155
See application file for complete search history.

(56) References Cited

U.S. PATENT DOCUMENTS

| | | | | |
|---|---|---|---|---|
| 5,729,230 | A * | 3/1998 | Jensen | H03M 3/396 341/118 |
| 6,614,374 | B1 * | 9/2003 | Gustavsson | H03H 19/004 341/118 |
| 6,989,778 | B2 | 1/2006 | Clara et al. | |
| 7,016,421 | B2 | 3/2006 | Yap et al. | |

(Continued)

OTHER PUBLICATIONS

U.S. Appl. No. 14/590,100, filed Jan. 6, 2015, Zhang et al.

(Continued)

*Primary Examiner* — Jean B Jeanglaude

(57) ABSTRACT

A continuous time delta sigma modulator includes a quantizer, a buffer module, and a reference module. The quantizer includes a comparator that updates a digital output each cycle of a clock signal based on a comparison of a reference potential with an input generated based on a sample of an analog signal. The buffer module receives the digital output, stores the digital output for a predetermined delay period, and outputs the digital output after the predetermined delay period as a delayed digital output. The predetermined delay period is less than one cycle of the clock signal. The reference module selectively varies the reference potential based on the delayed digital output.

20 Claims, 9 Drawing Sheets

(56) References Cited

U.S. PATENT DOCUMENTS

| | | | |
|---|---|---|---|
| 7,834,787 B2 | 11/2010 | Hong | |
| 7,936,293 B2 * | 5/2011 | Hamashita | H03M 3/42 341/143 |
| 2010/0156686 A1 | 6/2010 | Kim et al. | |
| 2012/0068867 A1 * | 3/2012 | Pagnanelli | H03M 3/468 341/120 |
| 2014/0159930 A1 | 6/2014 | Ho et al. | |

OTHER PUBLICATIONS

Cherry, James A., and W. Martin Snelgrove. "Excess Loop Delay in Continuous-Time Delta-Sigma Modulators." IEEE Transactions on Circuits and Systems—II: Analog and Digital Signal Processing, vol. 46, No. 4, Apr. 1999; 14 Pages.

Fontaine, Paul et al. "A Low-Noise Low-Voltage CT ΔΣ Modulator with Digital Compensation of Excess Loop Delay." IEEE International Solid-State Circuits Conference (ISSCC) 2005, Session 27, Filters and Continuous-Time ΔΣ Converters, 27.4; 3 Pages.

Matsukawa, Kazuo et al. "A 10 MHz BW 50 fJ/conv. Continuous Time ΔΣ Modulator with High-order Single Opamp Integrator using Optimization-based Design Method." 2012 IEEE Symposium on VLSI Circuits Digest of Technical Papers. Moriguchi City, Osaka; 2 Pages.

Mitteregger, Gerhard et al. "A 20-mW 640-MHz CMOS Continuous-Time ΣΔ ADC With 20-MHz Signal Bandwidth, 80-dB Dynamic Range and 12-bit ENOB." IEEE Journal of Solid-State Circuits, vol. 41, No. 12, Dec. 2006; 9 Pages.

Shettigar, Pradeep and Shanthi Pavan. "A 15mW 3.6GS/s CT-ΔΣ ADC with 36MHz Bandwidth and 83dB DR in 90nm CMOS." IEEE International Solid-State Circuits Conference (ISSCC) 2012, Session 8, Delta-Sigma Converters, 8.6. Madras, India; 3 Pages.

Shu, Yun-Shiang et al. "A 28fJ/conv-step CT ΔΣ Moduator with 78dB DR and 18MHz BW in 28nm CMOS Usng a Highly Digital Multibit Quantizer." IEEE International Solid-State Circuits Conference (ISSCC) 2013, Session 15, Data Converter Techniques, 15.1. Hsinchu, Taiwan; 3 Pages.

Vadipour, Morteza et al. "A 2.1mW/3.2mW Delay-Compensated GSM/WCDMA ΣΔ Analog-Digital Converter." IEEE 2008 Symposium on VLSI Circuits Digest of Technical Papers. Irvine, California; 2 Pages.

Witte, Pascal et al. "A 72dB-DR ΔΣ CT Modulator Using Digitally Estimated Auxiliary DAC Linearization Achieving 88fJ/conv in a 25MHz BW." IEEE International Solid-State Circuits Conference (ISSCC) 2012, Session 8, Delta-Sigma Converters, 8.5. Ulm, Germany and Freiburg, Germany; 3 Pages.

Yan, Shouli and Edgar Sánchez-Sinencio. "A Continuous-Time ΣΔ Modulator With 88-dB Dynamic Range and 1.1-MHz Signal Bandwidth." IEEE Journal of Solid-State Circuits, vol. 39, No. 1, Jan. 2004; 12 Pages.

* cited by examiner

DIGITAL TECHNIQUE FOR EXCESS LOOP DELAY COMPENSATION IN A CONTINUOUS-TIME DELTA SIGMA MODULATOR

CROSS-REFERENCE TO RELATED APPLICATIONS

This application is a continuation of U.S. patent Ser. No. 14/590,100 filed Jan. 6, 2015, which claims the benefit of U.S. Provisional Application No. 62/039,647 filed on Aug. 20, 2014. The disclosures of the above applications are incorporated herein by reference in their entirety.

FIELD

The present disclosure relates to analog to digital converters and more particularly to systems and methods for minimizing excess loop delay of continuous time delta sigma modulators.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Analog-to-digital converters (ADCs) convert samples of an analog input signal into digital values corresponding to the samples. Various types of ADCs are available, such as successive-approximation-register (SAR) ADCs, Delta-Sigma (ΔΣ) ADCs, and pipelined ADCs. ADCs may be used in various electronic devices, such as finite impulse resolution (FIR) digital to analog converters (DACs) and many other types of electronic devices.

SUMMARY

In a feature, a continuous time delta sigma modulator is disclosed. A quantizer includes a comparator that updates a digital output each cycle of a clock signal based on a comparison of a reference potential with an input generated based on a sample of an analog signal. A buffer module receives the digital output, stores the digital output for a predetermined delay period, and outputs the digital output after the predetermined delay period as a delayed digital output. The predetermined delay period is less than one cycle of the clock signal. A reference module selectively varies the reference potential based on the delayed digital output.

In further features, the predetermined delay period is one-half of one cycle of the clock signal.

In further features, the reference module includes: a switching module that includes a plurality of switching devices and a plurality of resistors that regulate the reference potential; and a switch control module that controls states of the switching devices based on the delayed digital output.

In further features: a digital to analog converter (DAC) converts the delayed digital output into an analog value; and an integrator generates the input based on the sample of the analog signal and the analog value.

In further features: a subtractor subtracts the analog value from the sample of the analog signal to produce an output, and the integrator generates the input based on a mathematical integral of the output of the subtractor.

In further features: the quantizer further includes N additional comparators that update N additional digital outputs each cycle of a clock signal based on comparisons of N additional reference potentials, respectively, with the input generated based on the sample of the analog signal; N is an integer greater than zero; the buffer module further stores the N digital additional outputs for the predetermined delay period and outputs the N digital output after the predetermined delay period as N additional delayed digital outputs, respectively; and the reference module selectively varies the N additional reference potentials based on the N additional delayed digital outputs.

In further features, a frequency of the clock signal is greater than a sampling frequency of the analog signal.

In a feature, a continuous time delta sigma modulator is disclosed. A quantizer includes N comparators that generate N digital outputs based on comparisons of (i) an input generated based on a sample of an analog signal with (ii) N reference potentials, respectively. A switching module includes a plurality of switching devices and a plurality of resistors and that, based on states of the switching devices, outputs the N reference potentials. A switch control module controls the states of the switching devices based on the N digital outputs.

In further features, a buffer module receives the N digital outputs, delays outputting the N digital outputs for less than one cycle of a clock signal, and outputs the N delayed digital outputs to the switch control module. The switch control module controls the states of the switching devices based on the N delayed digital outputs.

In further features, the buffer module delays outputting the N digital outputs for one-half of the cycle of the clock signal.

In further features, the N comparators update the N digital outputs once per cycle of the clock signal.

In further features: a digital to analog converter (DAC) converts the N delayed digital outputs into an analog value; and an integrator generates the input based on the sample of the analog signal and the analog value.

In further features: a subtractor subtracts the analog value from the sample of the analog signal to produce an output, and the integrator generates the input based on a mathematical integral of the output of the subtractor.

In a feature, a method includes: using a comparator of a quantizer of a continuous time delta sigma modulator, updating a digital output each cycle of a clock signal based on a comparison of a reference potential with an input generated based on a sample of an analog signal; receiving, using a buffer module, the digital output from the comparator; storing, using the buffer module, the digital output for a predetermined delay period outputting the digital output after the predetermined delay period as a delayed digital output, wherein the predetermined delay period is less than one cycle of the clock signal; and selectively varying the reference potential based on the delayed digital output.

In further features, the predetermined delay period is one-half of one cycle of the clock signal.

In further features, selectively varying the reference potential includes: controlling states of a plurality of switching devices based on the delayed digital output.

In further features the method further includes: converting the delayed digital output into an analog value using a digital to analog converter (DAC); and generating the input based on the sample of the analog signal and the analog value.

In further features the method further includes: subtracting, using a subtractor, the analog value from the sample of the analog signal to produce an output, wherein generating the input includes generating the input the input based on a mathematical integral of the output of the subtractor.

In further features the method further includes: updating, using N additional comparators of the quantizer of the continuous time delta sigma modulator, based on comparisons of N additional reference potentials, respectively, with the input generated based on the sample of the analog signal, wherein N is an integer greater than zero; storing, using the buffer module, the N digital additional outputs for the predetermined delay period and outputting the N digital output after the predetermined delay period as N additional delayed digital outputs, respectively; and selectively varying the N additional reference potentials based on the N additional delayed digital outputs.

In further features, a frequency of the clock signal is greater than a sampling frequency of the analog signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A quantizer of a delta sigma modulator generates a digital representation of a sample of an analog signal via a conversion process. During the conversion process, the quantizer generates digital outputs based on comparisons of an input with a plurality of reference potentials. The input is generated based on the sample of the analog signal.

One or more digital to analog converters (DACs) convert the digital outputs to corresponding analog values, and the input to the quantizer is updated based on the analog values. The quantizer updates the digital outputs based on the updated input. The input and the digital outputs are updated on multiple occasions (based on a clock signal) between times when the analog signal is sampled. This enables the digital outputs to be adjusted during the conversion process to best represent the sample of the analog signal.

Continuous time delta sigma modulators generally suffer from Excess Loop Delay (ELD). The ELD of a delta sigma modulator may correspond to a delay period associated with the one or more DACs, a delay period of the components that provide the input to the quantizer, and a delay period of the quantizer itself. The delay period of the quantizer may correspond to a period between when the quantizer is prompted to update the digital outputs (e.g., based on the clock signal) and when the quantizer actually outputs the updated digital outputs. Relative to the delay period of the quantizer, the delay period of the DAC(s) and the delay period of the components that provide the input to the quantizer may be negligible.

The ELD of a delta sigma modulator can be reduced by providing an adder, an additional DAC, and one or more delay buffers. However, this may increase power consumption of the delta sigma modulator.

A delta sigma modulator according to the present disclosure includes a reference module that adjusts the reference potentials provided to the quantizer during the conversion process. As described above, the quantizer compares an input with the reference potentials to generate the digital outputs. Relative to the use of an adder and an additional DAC, adjusting the reference potentials decreases power consumption of the delta sigma modulator.

Figure 1:
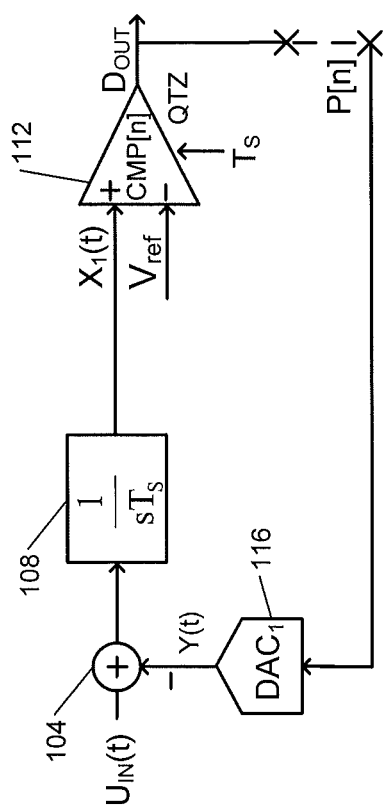
FIG. 1 is a functional block diagram of an example delta sigma modulator.

Referring now to FIG. 1, a functional block diagram of an example first-order continuous time delta sigma ($\Delta\Sigma$) modulator is presented. The delta sigma modulator includes an adder 104, an integrator 108, a quantizer including a plurality of comparators 112, and a DAC 116. The DAC 116 generates an analog output ($Y(t)$) based on the digital outputs of the comparators 112.

The adder 104 includes a non-inverting input that receives a sample of an analog signal ($U_{IN}(t)$) and an inverting input that receives the analog output of the DAC 116. The adder 104 subtracts the analog output of the DAC 116 from the sample of the analog signal. The integrator 108 integrates the output of the adder 104 and provides an integrated output ($X_1(t)$) to the comparators 112. The analog signal is sampled each predetermined sampling period for digitization by the delta sigma modulator. When the conversion process is complete, the digital outputs of the comparators 112 are a digital representation of the sample of the analog input signal.

Figure 2:
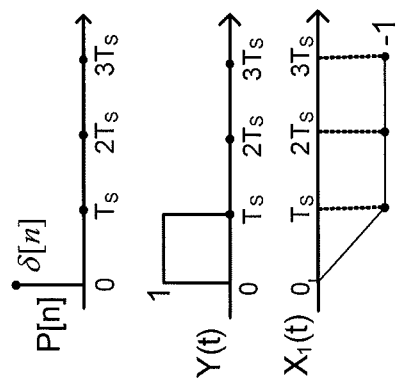
FIG. 2 is an example graph illustrating impulse responses of the example delta sigma modulator of FIG. 1.

The comparators 112 compare the integrated output with respective references ($V_{ref}$) at each clock period (Ts). In this case, the references are fixed. The comparators 112 generate the digital outputs based on the comparisons, respectively. The clock period (Ts) is shorter than the predetermined sampling period (of the analog input signal) so multiple sets of the digital outputs can be fed back for comparison with each sample of the analog input signal. FIG. 2 includes example graphs depicting example responses of the delta sigma modulator of FIG. 1 to the application of an impulse to the DAC 116.

Figure 3:
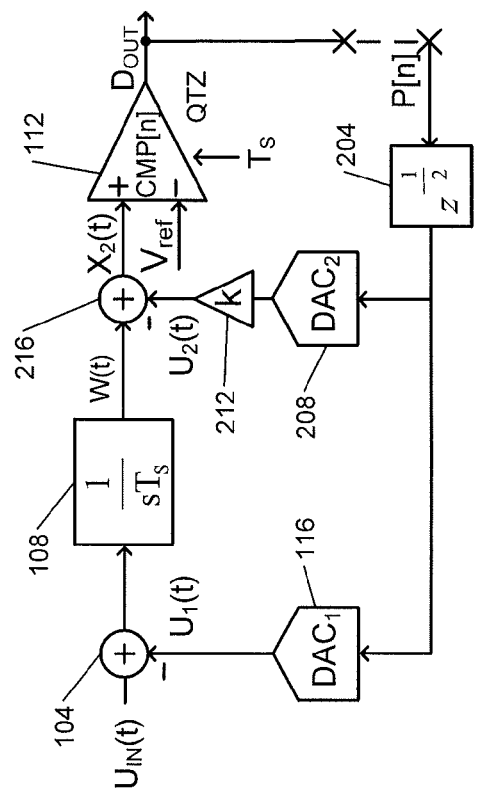
FIG. 3 is a functional block diagram of an example delta sigma modulator including components for compensating for excess loop delay.

Referring now to FIG. 3, a functional block diagram of an example first-order continuous time delta sigma modulator is presented. The example delta sigma modulator of FIG. 3 includes additional components for compensating for excess loop delay (ELD). However, the additional components are configured such that the input to the comparators 112 is the same in the example of FIG. 3 as the input to the comparators 112 in the example of FIG. 1.

A buffer module 204 buffers the digital outputs of the comparators 112 for one-half of the clock period (Ts) before outputting the (delayed) digital outputs. The DAC 116 generates the analog output based on the delayed digital outputs.

A second DAC 208 generates a second analog output based on the delayed digital outputs. A gain module 212 applies a gain (k) to the second analog output to produce a gain applied analog output ($U_2(t)$). For example only, the gain may be 0.5 corresponding to the one-half clock period delay provided by the buffer module 204. While the example including a one-half clock period delay and a gain of 0.5 is shown and discussed, another suitable delay period and another suitable gain may be used.

A second adder 216 includes a non-inverting input that receives the integrated output of the integrator 108 (W(t) in the example of FIG. 3) and an inverting input that receives a negative value of the gain applied analog output. The second adder 216 subtracts the gain applied analog output from the integrated output. The comparators 112 compare the output of the second adder 216 ($X_2(t)$) with the respective references ($V_{ref}$) each predetermined clock period (Ts). As in the example of FIG. 1, the references are fixed values in the example of FIG. 3. The comparators 112 generate the digital outputs based on the comparisons, respectively.

Figure 4:
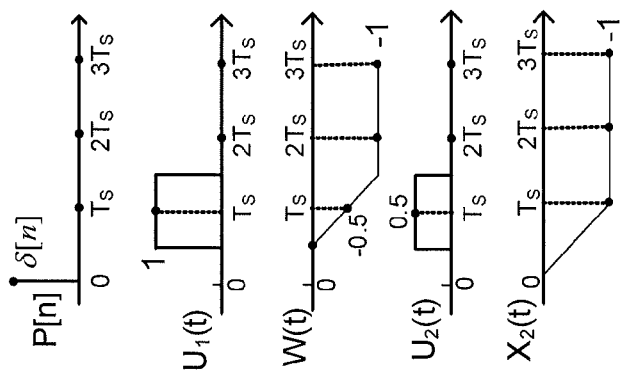
FIG. 4 includes graphs illustrating example impulse responses of the example delta sigma modulator of FIG. 3.

FIG. 4 includes graphs depicting example responses of the delta sigma modulator of FIG. 3 to the application of an impulse to the buffer module 204. As can be seen by comparing FIGS. 2 and 4, the input to the comparators 112 ($X_2(t)$) in the example of FIG. 3 resulting from the application of the impulse is the same as the input to the comparators 112 ($X_1(t)$) in the example of FIG. 1 resulting from the application of the impulse.

The example of FIG. 3 reduces the quantizer delay to one half of the sampling period. However, the example of FIG. 3 includes the second DAC 208 and the second adder 216 and, therefore, has the associated additional power consumption.

Figure 5:
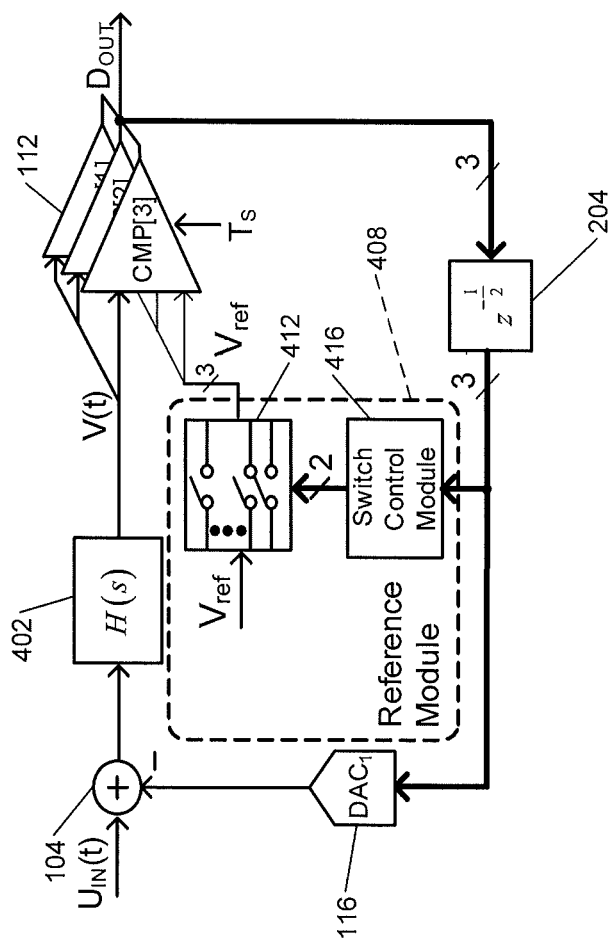
FIG. 5 is a functional block diagram of an example delta sigma modulator including a reference module for compensating for excess loop delay.

FIG. 5 is a functional block diagram of an example third order continuous time sigma delta modulator having a two-bit quantizer. While the example of a third order sigma delta modulator having a two-bit quantizer is shown and will be discussed, the present application is applicable to second and higher order sigma delta modulators including multiple-bit quantizers.

A transfer function (H(s)) corresponding to one or more integrators, feed-forward components, feed-back components, and other components implemented upstream of the comparators 112 are represented by transfer function block 402. The example delta sigma modulator of FIG. 5 includes a reference module 408 that varies the reference voltages supplied to the comparators 112.

Figure 6:
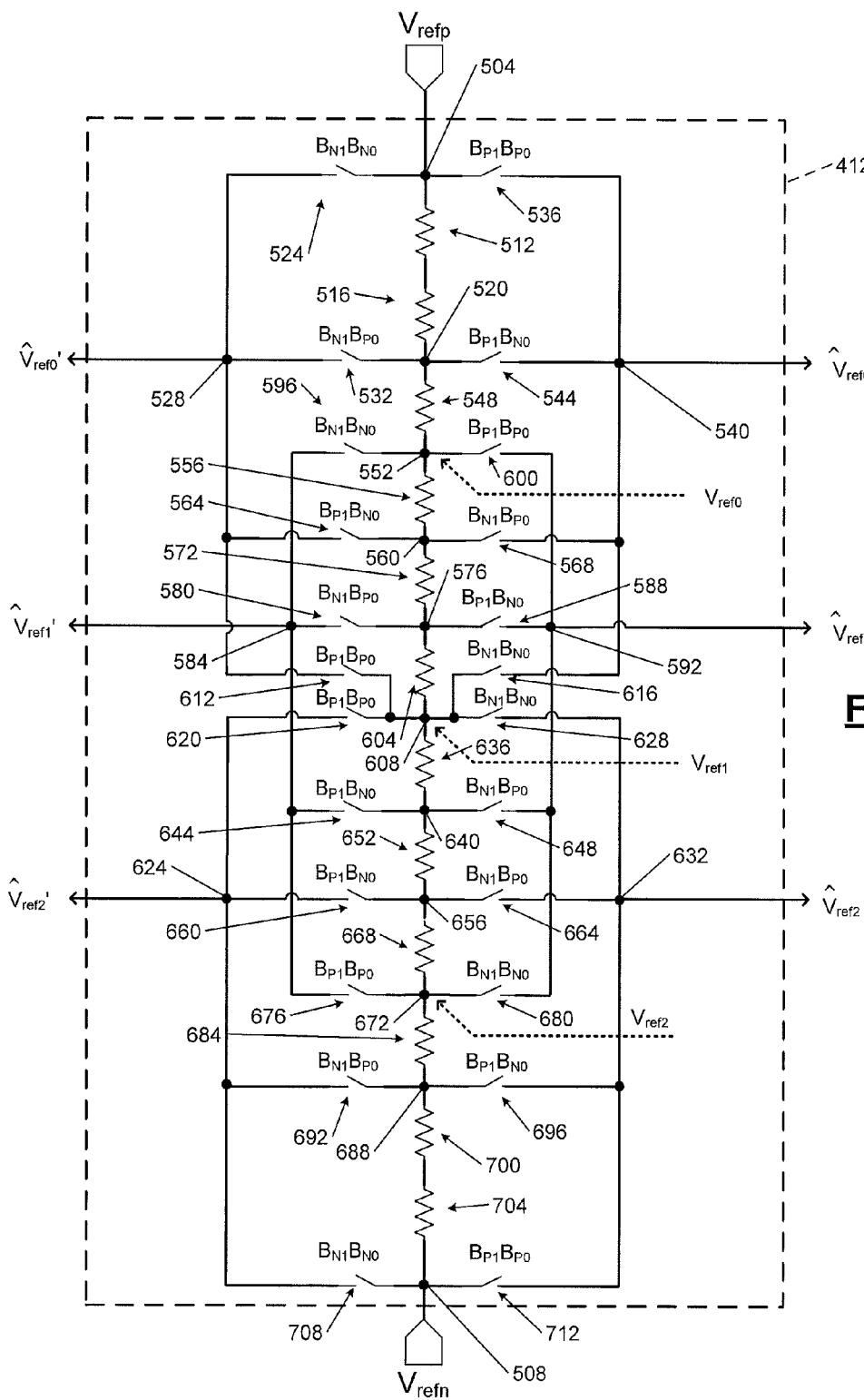
FIG. 6 is an example schematic of a switching module of the reference module.

The reference module 408 includes a switching module 412 (see also FIG. 7) and a switch control module 416 (see also FIG. 6). The switching module 412 includes a plurality of switching devices. The switch control module 416 controls the states of the switching devices of the switching module 412 based on the delayed digital outputs from the buffer module 204.

Based on the states of the switching devices, the switching module 412 outputs adjusted reference voltages ($V_{ref}$) to the comparators 112, respectively, derived from one or more input reference voltages ($V_{ref}$). The adjusted reference voltages are variable and are controlled by the switch control module 416 based on the delayed digital outputs from the buffer module 204. As described above, the reference voltages supplied to the comparators of the example delta sigma modulators of FIGS. 1 and 3 are fixed. Relative to the example delta sigma modulator of FIG. 3, the example delta sigma modulator of FIG. 5 consumes less power.

Referring now to FIG. 6, an example schematic of the switching module 412 is presented. A positive reference potential ($V_{refp}$) is connected at a node 504. A negative reference potential ($V_{refn}$) is connected at a node 508. One or more resistors, such as resistors 512 and 516, are connected between the node 504 and a node 520.

A switching device 524 is connected between the node 504 and a node 528. A switching device 532 is connected between the node 520 and the node 528. A switching device 536 is connected between the node 504 and a node 540. A switching device 544 is connected between the node 520 and the node 540. Reference potentials at the node 528 and the node 540 are provided to a first one of the comparators 112 for comparison with an input (V(t) in the case of FIG. 5).

One or more resistors, such as resistor 548, are connected between the node 520 and a node 552. One or more resistors, such as resistor 556, are connected between the node 552 and a node 560. A switching device 564 is connected between the node 560 and the node 528. A switching device 568 is connected between the node 560 and the node 540.

One or more resistors, such as resistor 572, are connected between the node 560 and a node 576. A switching device 580 is connected between the node 576 and a node 584. A switching device 588 is connected between the node 576 and a node 592. A switching device 596 is connected between the node 552 and the node 584. A switching device 600 is connected between the node 552 and the node 592.

One or more resistors, such as resistor 604, are connected between the node 576 and a node 608. A switching device 612 is connected between the node 608 and the node 528. A switching device 616 is connected between the node 608 and the node 540.

A switching device 620 is connected between the node 608 and a node 624. A switching device 628 is connected between the node 608 and a node 632. Reference potentials at the node 624 and the node 632 are provided to a third one of the comparators 112 for comparison with the input.

One or more resistors, such as resistor 636, are connected between the node 608 and a node 640. A switching device 644 is connected between the node 640 and the node 584. A switching device 648 is connected between the node 640 and the node 592.

One or more resistors, such as resistor 652, are connected between the node 640 and a node 656. A switching device 660 is connected between the node 656 and the node 624. A switching device 664 is connected between the node 656 and the node 632.

One or more resistors, such as resistor 668, are connected between the node 656 and a node 672. A switching device 676 is connected between the node 672 and the node 584. A switching device 680 is connected between the node 672 and the node 592.

One or more resistors, such as resistor 684, are connected between the node 672 and a node 688. A switching device 692 is connected between the node 688 and the node 624. A switching device 696 is connected between the node 688 and the node 632.

One or more resistors, such as resistors 700 and 704, are connected between the node 688 and the node 508. A switching device 708 is connected between the node 508 and the node 624. A switching device 712 is connected between the node 508 and the node 632.

The resistors of the switching module 412 provide voltage dividers. The states of the switching devices control which resistors are used to provide the voltage dividers and, therefore, the reference potentials provided to the comparators 112. The switch control module 416 controls the states of the switching devices, as discussed further below, to control the respective reference potentials provided to the comparators 112.

Figure 7:
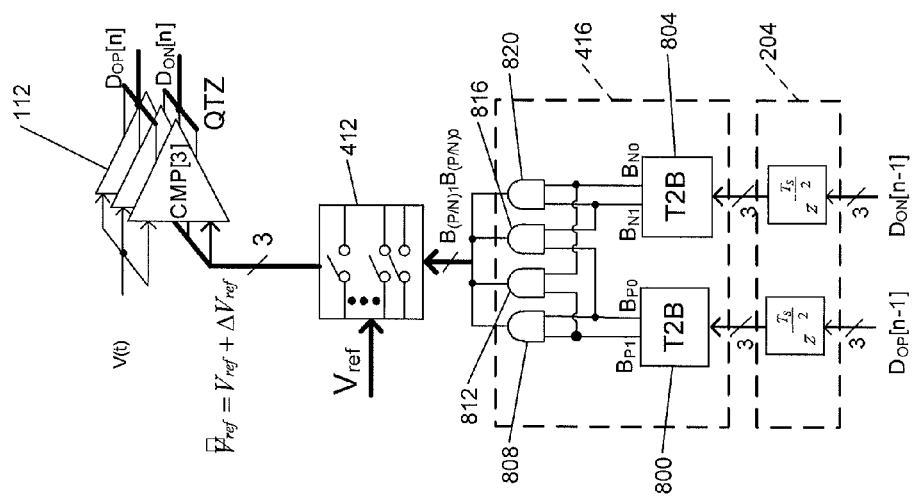
FIG. 7 is an example schematic of a switch control module of the reference module.

Referring now to FIG. 7, a functional block diagram including an example implementation of the switch control module 416. The switch control module 416 controls the states of the switching devices of the switching module 412 based on the delayed digital outputs of the comparators 112.

In the example of FIG. 7, the buffer module 204 is illustrated as two different one-half clock cycle buffer modules. One of the one-half clock period buffer modules receives the three digital bits of a positive differential output of the comparators 112 ($D_{op}$), and the other one of the one-half clock period buffer modules receives the three digital bits of a negative differential output of the comparators 112 ($D_{on}$). Each of the one-half clock period buffer modules delays the output of the received digital bits for one-half of a cycle of the clock signal (Ts) input to the comparators 112.

The switch control module 416 generates signals that are applied to the switching devices of the switching module 412. The switch control module 416 may include one or more encoders, such as thermometer to binary (T2B) encoders 800 and 804. While T2B encoders are shown and described, another suitable type of encoder may be used.

The T2B encoder 800 sets the states of first and second positive digital signals (BP1 and BP0) based on the three delayed digital bits of the positive differential output of the comparators 112. The T2B encoder 804 sets the states of first and second negative digital signals (BN1 and BN0) based on the three delayed digital bits of the negative differential output of the comparators 112.

The switch control module 416 also includes one or more digital logic gates that generate switching signals that are applied to the switching devices of the switching module 412 and that control the states of the switching devices. For example, the switch control module 416 may include first, second, third, and fourth AND gates 808, 812, 816, and 820, respectively. While an example including AND gates is shown and described, another suitable arrangement of logic gates may be implemented.

The first AND gate 808 generates a first switching signal (BP1, BP0) as a logical AND function of the first positive digital signal (BP1) and the second positive digital signal (BP0). Ones of the switching devices labeled BP1BP0 in FIG. 6 may open and close based on the state of the first switching signal. For example, the ones of the switching devices labeled BP1BP0 in FIG. 6 may close when the first switching signal is in a first state (e.g., digital 1) and may open when the first switching signal is in a second state (e.g., digital 0).

The second AND gate 812 generates a second switching signal (BP1, BN0) as a logical AND function of the first positive digital signal (BP1) and the second negative digital signal (BN0). Ones of the switching devices labeled BP1 BN0 in FIG. 6 may open and close based on the state of the second switching signal. For example, the ones of the switching devices labeled BP1BN0 in FIG. 6 may close when the second switching signal is in the first state and may open when the second switching signal is in the second state.

The third AND gate 816 generates a third switching signal (BP0, BN1) as a logical AND function of the second positive digital signal (BP0) and the first negative digital signal (BN1). Ones of the switching devices labeled BP0BN1 in FIG. 6 may open and close based on the state of the third switching signal. For example, the ones of the switching devices labeled BP0BN1 in FIG. 6 may close when the third switching signal is in the first state and may open when the third switching signal is in the second state.

The fourth AND gate 820 generates a fourth switching signal (BP0, BN0) as a logical AND function of the second positive digital signal (BP0) and the second negative digital signal (BN0). Ones of the switching devices labeled BP0BN0 in FIG. 6 may open and close based on the state of the fourth switching signal. For example, the ones of the switching devices labeled BP0BN0 in FIG. 6 may close when the fourth switching signal is in the first state and may open when the fourth switching signal is in the second state.

A table illustrating example possible combinations of the digital outputs of the comparators 112, example resulting outputs of the T2B encoders 800 and 804, and example resulting states of the first-fourth switching signals is provided below.

| $D_{OP}$ | $D_{ON}$ | $B_{P1}$ | $B_{P0}$ | $B_{N1}$ | $B_{N0}$ | $B_{P1}B_{P0}$ | $B_{P1}B_{N0}$ | $B_{P0}B_{N1}$ | $B_{N1}B_{N0}$ | $\Delta V_{ref}$ |
|---|---|---|---|---|---|---|---|---|---|---|
| 111 | 000 | 1 | 1 | 0 | 0 | 1 | 0 | 0 | 0 | $-/+V_{FS}/4$ |
| 011 | 100 | 1 | 0 | 0 | 1 | 0 | 1 | 0 | 0 | $-/+V_{FS}/12$ |
| 001 | 110 | 0 | 1 | 1 | 0 | 0 | 0 | 1 | 0 | $+/-V_{FS}/12$ |
| 000 | 111 | 0 | 0 | 1 | 1 | 0 | 0 | 0 | 1 | $+/-V_{FS}/4$ |

The table also includes example adjustments ($\Delta V_{ref}$) to the reference potentials that may result in each case. The reference potentials (Vrefp and Vrefn) are adjusted based on the adjustment $\Delta V_{ref}$ to produce the respective reference potentials that are provided to the comparators 112. While the example of the switch control module 416 controlling four different groups of the switching devices of the switching module 412 is shown and discussed, the switch control module 416 may control the switching devices individually or using another suitable grouping.

Figure 8:
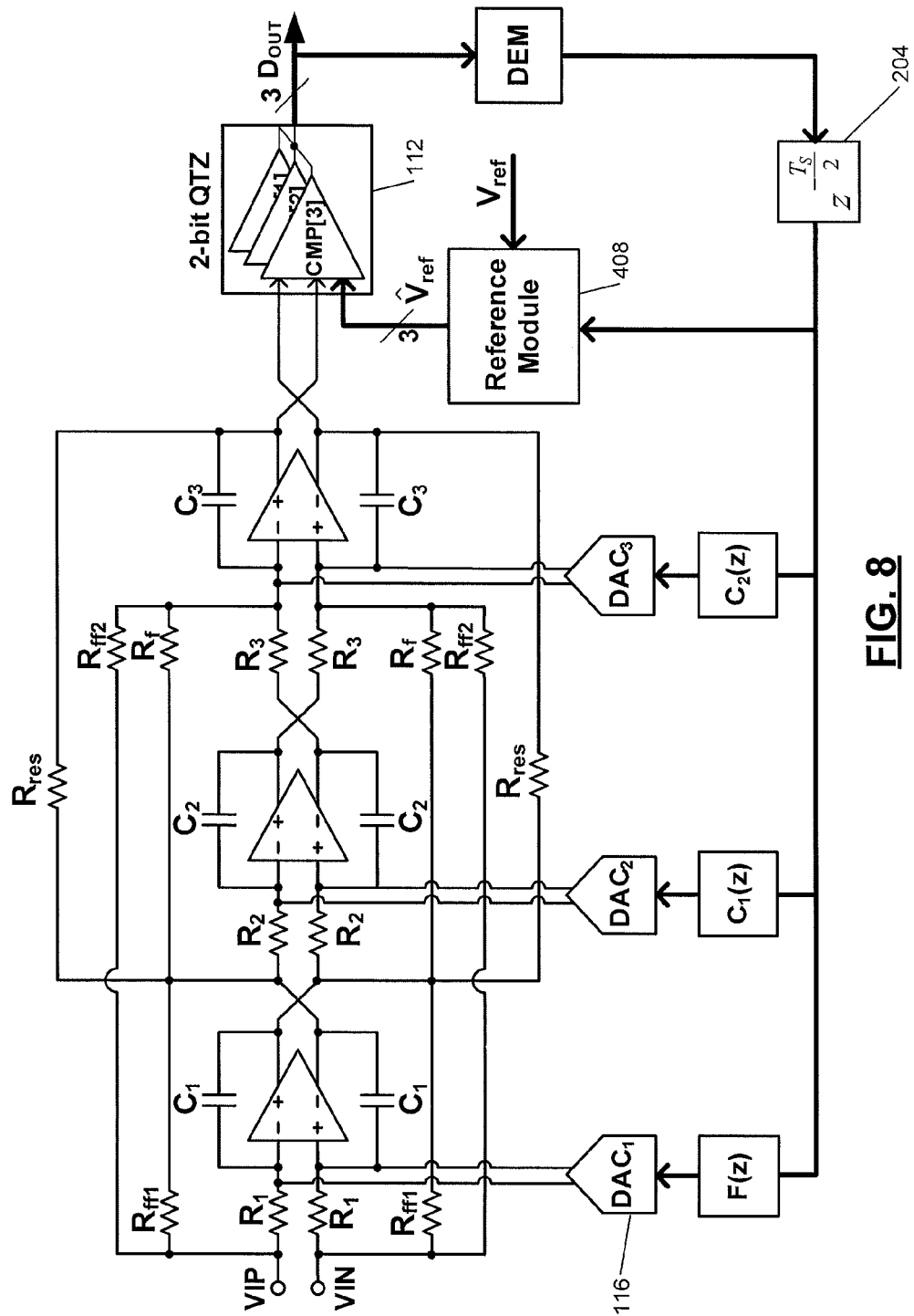
FIG. 8 is an example schematic of an example delta sigma modulator including the reference module.

FIG. 8 includes a schematic of an example third order continuous time sigma delta modulator having a two-bit quantizer that can be represented by the example of FIG. 5. As shown in FIG. 8, a dynamic element matching (DEM) module may be implemented.

Figure 9:
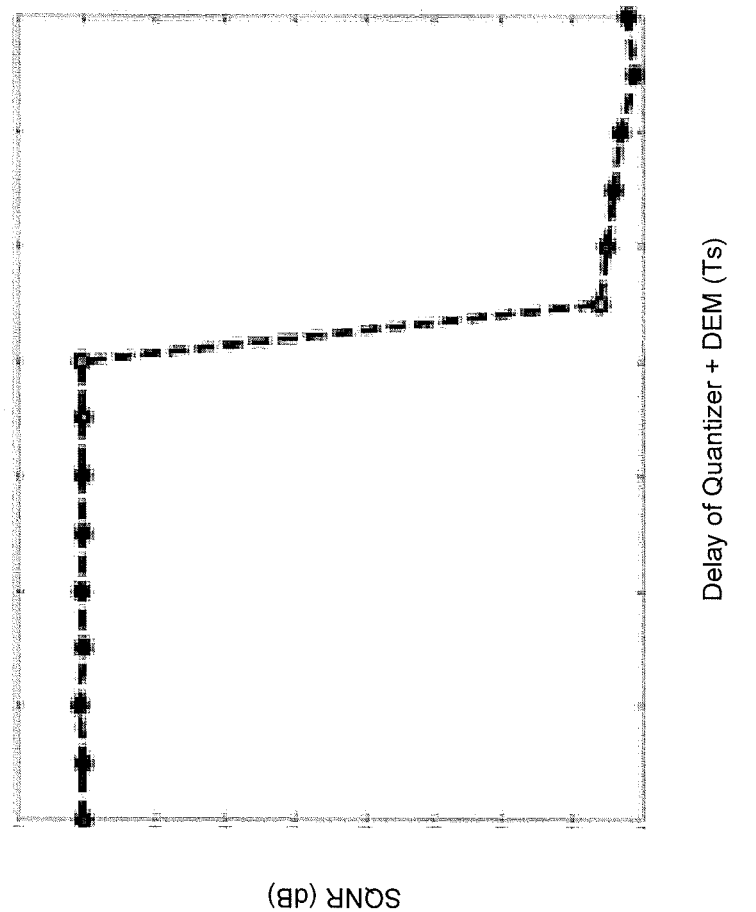
FIG. 9 is a graph of example signal to quantization noise ratio (SQNR) of the example sigma delta modulator of FIG. 8.
Figure 10:
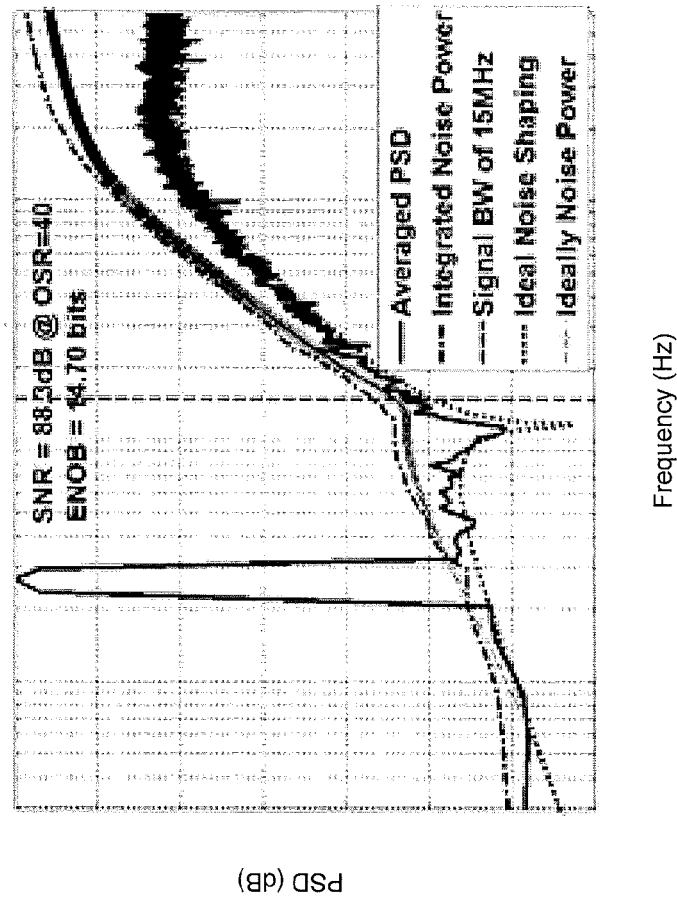
FIG. 10 is a graph including an example power spectral density (PSD) of the example sigma delta modulator of FIG. 8.

FIG. 9 is an example graph of signal to quantization noise ratio (SQNR) versus delay of the quantizer and the DEM of the example third order continuous time sigma delta modulator of FIG. 8. FIG. 10 is an example graph including a power spectral density (PSD) of the example third order continuous time sigma delta modulator of FIG. 8.

Figure 11:
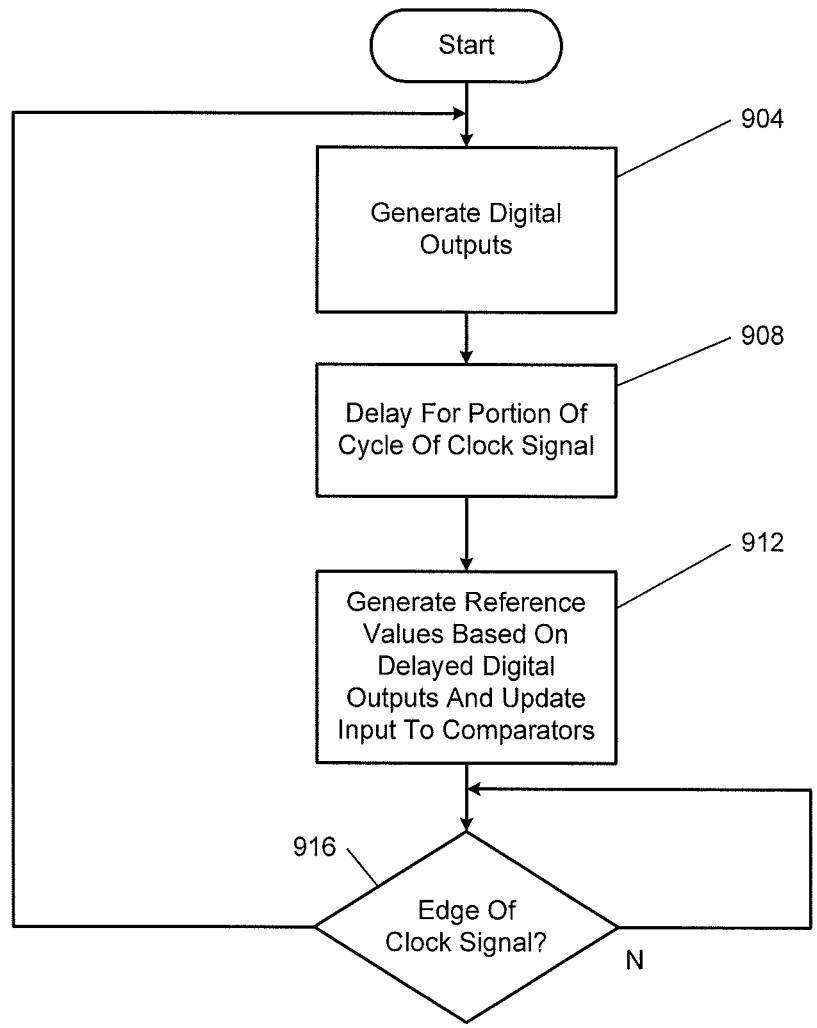
FIG. 11 is a flowchart depicting an example method that may be performed by a delta sigma modulator.

Referring now to FIG. 11, a flowchart depicting an example method performed by a delta sigma modulator is presented. Control may begin with 904 where the comparators 112 generate the digital outputs based on comparisons of a given input and the respective references.

At 908, the buffer module 204 delays the provision of the digital outputs to the DAC 116 and to the reference module 408 for a predetermined period, such as one-half of a cycle of the clock signal input to the comparators 112. At 912, the reference module 408 generates the respective references provided to the comparators 112 based on the delayed digital outputs. Also at 912, the DAC 116 generates the analog value based on the delayed digital outputs, and the input to the comparators 112 is updated. At 916, the comparators 112 detect whether an edge (e.g., rising or falling) of the clock signal is present. If 916 is true, control returns to 904 where the comparators update the digital outputs based on comparisons of the updated input with the respective references. If 916 is false, control may remain at 916.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A continuous time delta sigma modulator, comprising:
 a quantizer including a comparator that updates a digital output each cycle of a clock signal based on a comparison of a reference potential with an input generated based on a sample of an analog signal;
 a buffer module that receives the digital output, that stores the digital output for a predetermined delay period, and that outputs the digital output after the predetermined delay period as a delayed digital output,
 wherein the predetermined delay period is less than one cycle of the clock signal; and
 a reference module that selectively varies the reference potential based on the delayed digital output.

2. The continuous time delta sigma modulator of claim 1 wherein the predetermined delay period is one-half of one cycle of the clock signal.

3. The continuous time delta sigma modulator of claim 1 wherein the reference module includes:

a switching module that includes a plurality of switching devices and a plurality of resistors that regulate the reference potential; and a switch control module that controls states of the switching devices based on the delayed digital output.

4. The continuous time delta sigma modulator of claim 1 further comprising:

a digital to analog converter (DAC) that converts the delayed digital output into an analog value; and an integrator that generates the input based on the sample of the analog signal and the analog value.

5. The continuous time delta sigma modulator of claim 4 further comprising:

a subtractor that subtracts the analog value from the sample of the analog signal to produce an output, wherein the integrator generates the input based on a mathematical integral of the output of the subtractor.

6. The continuous time delta sigma modulator of claim 1 wherein:

the quantizer further includes N additional comparators that update N additional digital outputs each cycle of a clock signal based on comparisons of N additional reference potentials, respectively, with the input generated based on the sample of the analog signal;

N is an integer greater than zero;

the buffer module further stores the N digital additional outputs for the predetermined delay period and outputs the N digital output after the predetermined delay period as N additional delayed digital outputs, respectively; and the reference module selectively varies the N additional reference potentials based on the N additional delayed digital outputs.

7. The continuous time delta sigma modulator of claim 1 wherein a frequency of the clock signal is greater than a sampling frequency of the analog signal.

8. A continuous time delta sigma modulator, comprising:

a quantizer that includes N comparators that generate N digital outputs based on comparisons of (i) an input generated based on a sample of an analog signal with (ii) N reference potentials, respectively;

a switching module that includes a plurality of switching devices and a plurality of resistors and that, based on states of the switching devices, outputs the N reference potentials; and a switch control module that controls the states of the switching devices based on the N digital outputs.

9. The continuous time delta sigma modulator of claim 8 further comprising a buffer module that receives the N digital outputs, that delays outputting the N digital outputs for less than one cycle of a clock signal, and that outputs the N delayed digital outputs to the switch control module, wherein the switch control module controls the states of the switching devices based on the N delayed digital outputs.

10. The continuous time delta sigma modulator of claim 9 wherein the buffer module delays outputting the N digital outputs for one-half of the cycle of the clock signal.

11. The continuous time delta sigma modulator of claim 9 wherein the N comparators update the N digital outputs once per cycle of the clock signal.

12. The continuous time delta sigma modulator of claim 9 further comprising:

a digital to analog converter (DAC) that converts the N delayed digital outputs into an analog value; and an integrator that generates the input based on the sample of the analog signal and the analog value.

13. The continuous time delta sigma modulator of claim 12 further comprising:

a subtractor that subtracts the analog value from the sample of the analog signal to produce an output, wherein the integrator generates the input based on a mathematical integral of the output of the subtractor.

14. A method comprising:

using a comparator of a quantizer of a continuous time delta sigma modulator, updating a digital output each cycle of a clock signal based on a comparison of a reference potential with an input generated based on a sample of an analog signal;

receiving, using a buffer module, the digital output from the comparator;

storing, using the buffer module, the digital output for a predetermined delay period outputting the digital output after the predetermined delay period as a delayed digital output, wherein the predetermined delay period is less than one cycle of the clock signal; and selectively varying the reference potential based on the delayed digital output.

15. The method of claim 14 wherein the predetermined delay period is one-half of one cycle of the clock signal.

16. The method of claim 14 wherein selectively varying the reference potential includes:

controlling states of a plurality of switching devices based on the delayed digital output.

17. The method of claim 14 further comprising:

converting the delayed digital output into an analog value using a digital to analog converter (DAC); and generating the input based on the sample of the analog signal and the analog value.

18. The method of claim 17 further comprising:

subtracting, using a subtractor, the analog value from the sample of the analog signal to produce an output, wherein generating the input includes generating the input the input based on a mathematical integral of the output of the subtractor.

19. The method of claim 14 further comprising:

updating, using N additional comparators of the quantizer of the continuous time delta sigma modulator, based on comparisons of N additional reference potentials, respectively, with the input generated based on the sample of the analog signal, wherein N is an integer greater than zero;

storing, using the buffer module, the N digital additional outputs for the predetermined delay period and outputting the N digital output after the predetermined delay period as N additional delayed digital outputs, respectively; and selectively varying the N additional reference potentials based on the N additional delayed digital outputs.

20. The method of claim 14 wherein a frequency of the clock signal is greater than a sampling frequency of the analog signal.

* * * * *

UNITED STATES PATENT AND TRADEMARK OFFICE
CERTIFICATE OF CORRECTION

PATENT NO. : 9,294,120 B2
APPLICATION NO. : 14/822061
DATED : March 22, 2016
INVENTOR(S) : Yi Zhang et al.

It is certified that error appears in the above-identified patent and that said Letters Patent is hereby corrected as shown below:

In the Specification:

| | |
|---|---|
| Column 6, Line 27 | After "node 592.", insert --Reference potentials at the node 584 and the node 592 are provided to a second one of the comparators 112 for comparison with the input.-- |
| Column 7, Line 35 | Delete "(BP1 and BP0)" and insert --($B_{P1}$ and $B_{P0}$)-- |
| Column 7, Line 38 | Delete "(BN1 and BN0)" and insert --($B_{N1}$ and $B_{N0}$)-- |
| Column 7, Line 51 | Delete "(BP1 and BP0)" and insert --($B_{P1}$ and $B_{P0}$)-- |
| Column 7, Line 52 | Delete "(BP1)" and insert --($B_{P1}$)-- |
| Column 7, Line 53 | Delete "(BP0)." and insert --($B_{P0}$).-- |
| Column 7, Line 53 | Delete "BP1BP0" and insert --$B_{P1}B_{P0}$-- |
| Column 7, Line 56 | Delete "BP1BP0" and insert --$B_{P1}B_{P0}$-- |
| Column 7, Line 60 | Delete "(BP1, BN0)" and insert --($B_{P1}$, $B_{N0}$)-- |
| Column 7, Line 61 | Delete "(BP1)" and insert --($B_{P1}$)-- |
| Column 7, Line 62 | Delete "(BN0)." and insert --($B_{N0}$).-- |
| Column 7, Lines 62-63 | Delete "BP1 BN0" and insert --$B_{P1}B_{N0}$-- |
| Column 7, Line 65 | Delete "BP1BN0" and insert --$B_{P1}B_{N0}$-- |
| Column 8, Line 2 | Delete "(BP0, BN1)" and insert --($B_{P0}$, $B_{N1}$)-- |
| Column 8, Line 3 | Delete "(BP0)" and insert --($B_{P0}$)-- |
| Column 8, Line 3 | Delete "(BN1)." and insert --($B_{N1}$).-- |
| Column 8, Line 4 | Delete "BP0BN1" and insert --$B_{P0}B_{N1}$-- |
| Column 8, Line 7 | Delete "BP0BN1" and insert --$B_{P0}B_{N1}$-- |
| Column 8, Line 11 | Delete "(BP0, BN0)" and insert --($B_{P0}$, $B_{N0}$)-- |
| Column 8, Line 12 | Delete "(BP0)" and insert --($B_{P0}$)-- |
| Column 8, Line 13 | Delete "(BN0)." and insert --($B_{N0}$).-- |
| Column 8, Line 13 | Delete "BP0BN0" and insert --$B_{P0}B_{N0}$-- |
| Column 8, Line 16 | Delete "BP0BN0" and insert --$B_{P0}B_{N0}$-- |
| Column 8, Line 34 | Delete "($\Delta$Vref)" and insert --($\Delta V_{ref}$)-- |

Signed and Sealed this
Twelfth Day of July, 2016

Michelle K. Lee
*Director of the United States Patent and Trademark Office*

CERTIFICATE OF CORRECTION (continued) Page 2 of 2
U.S. Pat. No. 9,294,120 B2

In the Specification:

| | |
|---|---|
| Column 8, Line 36 | Delete "(Vrefp and Vrefn)" and insert --($V_{refp}$ and $V_{refn}$)-- |
| Column 8, Line 37 | Delete "$\Delta$Vref" and insert --$\Delta V_{ref}$-- |